United States Patent [19]

Chinone et al.

[11] Patent Number: 4,775,980

[45] Date of Patent: Oct. 4, 1988

[54] DISTRIBUTED-FEEDBACK SEMICONDUCTOR LASER DEVICE

[75] Inventors: Naoki Chinone; Shinji Tsuji, both of Hachioji; Yoshihisa Fujisaki, Setagaya; Yasutoshi Kashiwada, Nishitama; Motohisa Hirao, Suginami; Hitoshi Nakamura, Hachioji; Akio Oishi, Kokubunji; Kenji Hiruma, Koganei; Tadashi Fukuzawa, Setagaya; Hiroyoshi Matumura, Iruma, all of Japan

[73] Assignee: Hitachi, Ltd., Tokyo, Japan

[21] Appl. No.: 759,136

[22] Filed: Jul. 26, 1985

Related U.S. Application Data

[63] Continuation-in-part of Ser. No. 681,820, Dec. 14, 1984, Pat. No. 4,665,528.

[30] Foreign Application Priority Data

Dec. 14, 1983 [JP] Japan .................................. 58-234238
Jul. 27, 1984 [JP] Japan .................................. 59-155222

[51] Int. Cl.$^4$ ............................ H01S 3/08; H01S 3/19
[52] U.S. Cl. ...................................... 372/96; 372/45; 372/50; 372/102

[58] Field of Search ...................... 372/96, 50, 44, 45, 372/102

[56] References Cited

U.S. PATENT DOCUMENTS

| 4,096,446 | 6/1978 | Haus et al. | 372/96 |
| 4,468,772 | 8/1984 | Oudar | 372/50 |
| 4,577,321 | 3/1986 | Carney et al. | 372/45 |

FOREIGN PATENT DOCUMENTS

0197788 11/1983 Japan .................................. 372/96

Primary Examiner—William L. Sikes
Assistant Examiner—Georgia Y. Epps
Attorney, Agent, or Firm—Antonelli, Terry & Wands

[57] ABSTRACT

A distributed feedback semiconductor laser provided with a grating which effects optical feedback by means of periodic corrugation disposed inside an optical resonator. The optical resonator has at least two regions having different Bragg wavelengths, and these regions are arranged longitudinally in the direction of an optical axis. The laser device can realize stable single longitudinal mode oscillation through variation of the refractive indexes of the regions nonuniformly around an average value.

11 Claims, 6 Drawing Sheets

1.55 μm
WAVE LENGTH

DISTRIBUTED-FEEDBACK SEMICONDUCTOR LASER DEVICE

This is a continuation-in-part of application Ser. No. 681,820, filed Dec. 14, 1984, now U.S. Pat. No. 4,665,528.

BACKGROUND OF THE INVENTION

1. Field of the Invention

This invention relates to a distributed-feedback semiconductor laser effecting single longitudinal mode oscillation.

2. Description of the Prior Art

A distributed-feedback semiconductor laser (hereinafter referred to as "DFB laser") has been examined which is provided with a grating inside the device in order to control the longitudinal modes of the semiconductor laser. In the conventional DFB laser, two modes having the same threshold gain exist in principle. In practical oscillation, oscillation is made in either one of these two modes. Therefore, it has been difficult to obtain single longitudinal mode oscillation with high reproducibility because of the structural variance when fabricating the laser devices.

Typical prior art references relating to the DFB laser are listed below:

(1) T. Matsuoka et al., Electron Lett., 18, 28(1982)
(2) S. Akiba et al., Jpn. J. Appl. Phys., 21, 1736(1982)

SUMMARY OF THE INVENTION

The present invention is directed to provide a DFB laser which stably oscillates in a single mode.

In a DFB laser the fundamental constituents are an active layer for emitting the light by an injected carrier, a cladding layer for confining the carrier in the active layer and a grating for causing distributed-feedback. In the conventional DFB laser, a longitudinal mode closest to the Bragg wavelength, which is determined by the period of the grating, has the smallest threshold gain, and one each longitudinal mode exists on both sides of Bragg wavelength. Therefore, it has been difficult to obtain a complete single mode. In other words, mode hopping occurs due to variance of devices produced or to the changes in temperature and current. To prevent this problem, two regions having different Bragg wavelengths are disposed in the direction of the optical axis of the device, and the wavelength of one longitudinal mode that has the smallest threshold gain in one of the regions is superposed with the wavelength of one longitudinal mode that has the smallest threshold gain in the other region. Since the longitudinal mode thus superposed has a smaller threshold gain than any other modes, stable single mode oscillation can be obtained.

The present invention will be described in further detail.

Figure 1A:
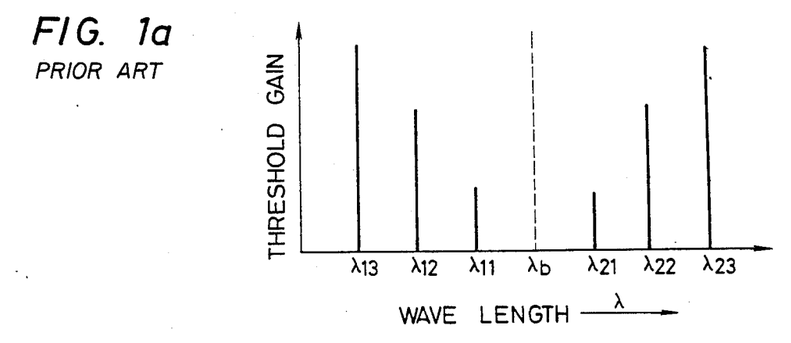
FIG. 1a is a diagram of the longitudinal mode of a typical prior art arrangement.

The longitudinal mode of the distributed-feedback laser has modes such as $\lambda_{11}, \lambda_{12} \ldots, \lambda_{21}, \lambda_{22} \ldots$ with the Bragg wavelength ($\lambda_b$) being the center, as shown in FIG. 1a. In the ordinary distributed-feedback laser, either one of $\lambda_{11}$ and $\lambda_{21}$ having the smallest threshold gain in each mode causes oscillation.

The Bragg wavelength ($\lambda_b$) can be expressed by the following formula with $\Lambda$ representing the period of the grating:

$$\lambda_b = 2n_{eff}\Lambda$$

where $n_{eff}$ is an effective refractive index, which is given by the following formula:

$$n_{eff} = \beta/R_0$$

where $R_0 = 2\pi/\lambda$, $\lambda$ is an oscillation wavelength and $\beta$ is a propagation constant.

These constants are explained in the literatures of the basic theory of the optical waveguide or semiconductor lasers. Refer, for example, to "HETEROSTRUCTURE LASERS", H. C. Casey, M. B. Panish, ACADEMIC PRESS, and the like.

Under the state described above, stable single mode oscillation cannot be realized because the modes of $\lambda_{11}$ and $\lambda_{21}$ have the same threshold gain and mode hopping occurs due to the changes in temperature and current.

Figure 1B:
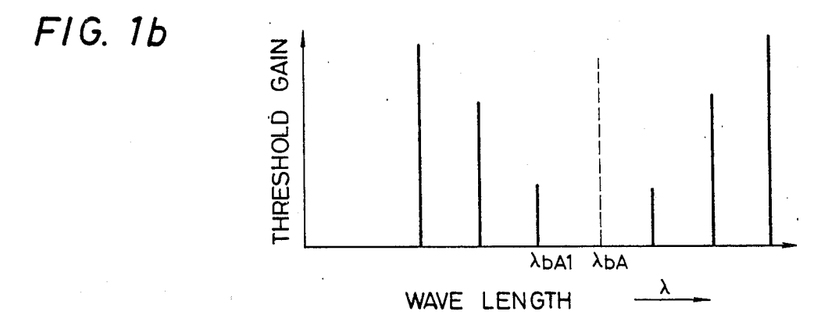
FIG. 1b is a diagram of the longitudinal mode of a first region in the present invention.
Figure 1C:
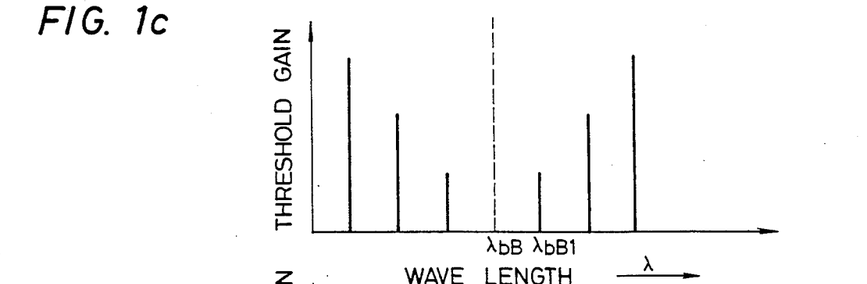
FIG. 1c is a diagram of the longitudinal mode of a second region in the present invention.
Figure 1D:
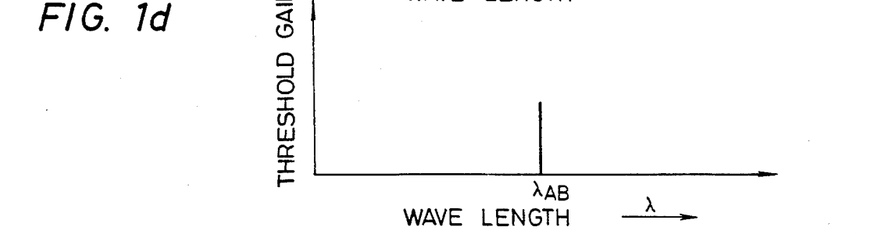
FIG. 1d is a diagram of a superposed longitudinal mode in the present invention.

Therefore, two regions I ($\lambda_{bI}$) and II ($\lambda_{bII}$) having different Bragg wavelength ($\lambda_b$) are cascaded in the direction of the optical axis in such a fashion that the modes $\lambda_{bAI}$ and $\lambda_{bAII}$ having the smallest threshold gain in the regions I and II overlap with each other. FIGS. 1b and 1c show this state. If the setting is made in this manner, only a single mode of the synthesized modes of the regions I and II has the smallest threshold gain. This state is illustrated in FIG. 1d. Therefore, oscillation always occurs in this mode ($\lambda_{AB}$), and complete single mode oscillation can be obtained.

Incidentally, the gap between the Bragg wavelength (e.g. $\lambda_{bA}$) of the adjacent mode (e.g. $\lambda_{bAI}$) can be expressed as follows:

$$\lambda_{bA}^2/n_{eff}L$$

where L is a cavity length.

As is obvious from the relation $\lambda_b = 2n_{eff}\Lambda$, the Bragg wavelength in a given region can be made different from that in other regions by, in principle, changing either $n_{eff}$ or $\Lambda$.

The effective refractive index $n_{eff}$ can be changed by changing the thickness of a laminate forming a waveguide or its composition. For example, the thickness of the active layer itself or the thickness of the optical guiding layer or cladding layer may be changed. A more definite construction will be explained in the embodiment of the invention that will follow.

The foregoing description deals with the case where the grating inside the cavity is divided into two regions, but it may of course be divided into a greater number of regions.

Though the foregoing description deals with the control of the longitudinal mode, heretofore known methods may be used to control the mode in a direction crossing at right angles the travelling direction of the laser light, or so-called "transverse mode". For example, a BH type (Buried Heterostructure) may be freely used in combination.

In addition, the present inventor has found that a single mode operation can be obtained in a distributed feedback laser by varying the averaged (effective) refractive index in the axial direction (the direction of propagation of beams) and thereby causing a difference in threshold gain of two modes of a Bragg wavelength.

In the semiconductor laser device designed as described above, the difference in the threshold gain between the longer and shorter wavelength sides of the Bragg wavelength is caused by varying the refractive index periodically, but nonuniformly around an average value, in the direction of propagation of beams within a range covered by an optical field in an active layer or in the vicinity thereof. Consequently, the selection of oscillation modes occurs, and thus a semiconductor laser device which operates stably in a single longitudinal mode even during modulation can be obtained.

The present invention can realize single longitudinal mode oscillation with high reproducibility without being affected by the variance of devices.

DESCRIPTION OF THE PREFERRED EMBODIMENTS

Hereinafter, some preferred embodiments of the present invention will be described.

Embodiment 1

Figure 2:
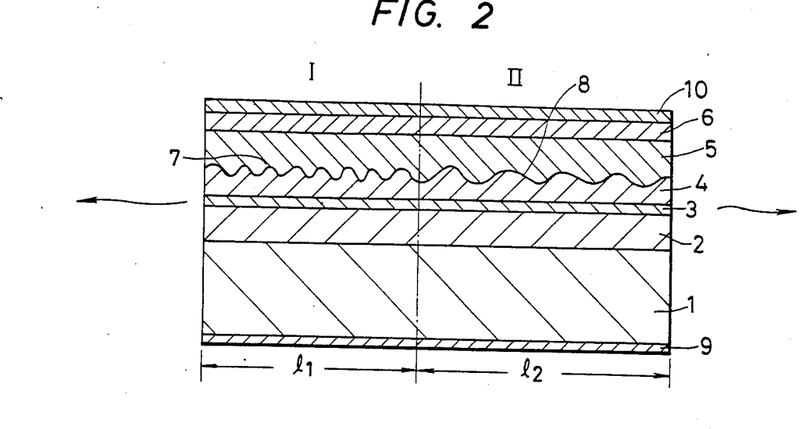
FIG. 2 is a sectional side view of a DFB laser in accordance with a first embodiment of the present invention.

FIG. 2 is a sectional view of the DFB laser on a plane parallel to the travelling direction of light. As shown in the drawing, an n-type InP layer (which is a buffer layer and is about 2 $\mu$m thick) 2, an $In_{0.582}Ga_{0.418}As_{0.898}P_{0.102}$ layer (active layer; 0.1 $\mu$m thick) 3, and a p-type $In_{0.717}Ga_{0.283}As_{0.613}P_{0.387}$ layer (optical guiding layer, up to 0.1 $\mu$m thick) 4 are sequentially formed by a known liquid epitaxial method on an n-type InP substrate 1. A photoresist layer is formed on the surface of the optical guiding layer 4, and a pattern having desired periodic corrugation is exposed by a known laser beam interference method. In this case, the periods in the regions I and II are made different from each other as shown in FIG. 2. In this embodiment, the period in the region I is 2,300 Å and that in the region II, 2,315 Å.

Next, the surface of the p-type InGaAsP layer 4 is selectively etched using the photoresist described above as the mask and an etching solution consisting of a mixed solution of HBr, HNO$_3$ and H$_2$O to form the periodic corrugation. The recess is up to 300 Å deep. After this periodic corrugation is formed, a p-type InP cladding layer (up to 1.0 $\mu$m thick) 5 and a p-type $In_{0.814}Ga_{0.186}As_{0.405}P_{0.595}$ layer 6 (contact layer; up to 0.5 $\mu$m thick) are again grown sequentially. An n-electrode 9 consisting of Au-Sn and a p-electrode 10 consisting of Cr-Au are formed on the side of the n-type InP substrate and on the side of p-type InGaAsP, respectively, and the devices are separated, whenever necessary. The cavity length is 300 $\mu$m.

Figure 3:
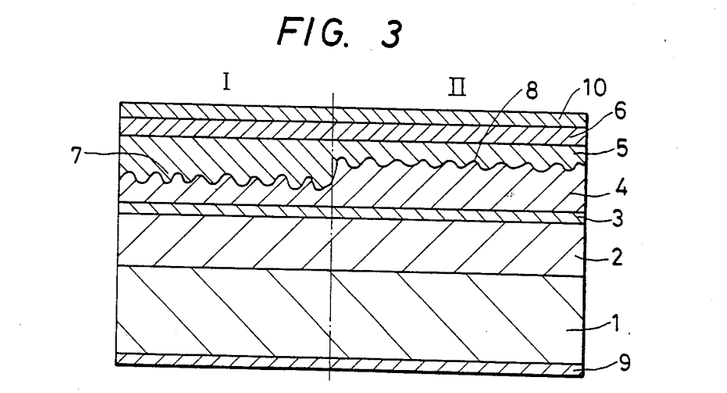
FIG. 3 is a sectional side view of the DFB laser of a variation of the first embodiment of the present invention.
Figure 4:
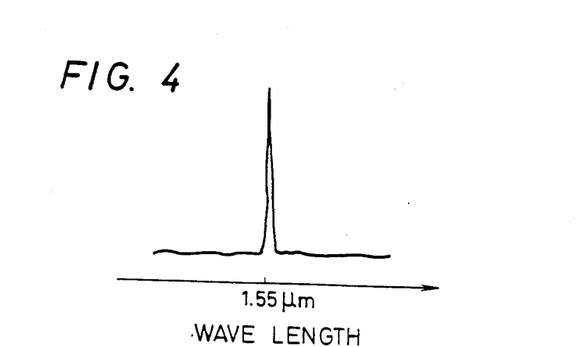
FIG. 4 is a diagram showing the oscillation spectrum of the device in accordance with the present invention.

FIG. 3 shows a variation of the first embodiment of the present invention. The layers up to the optical guiding layers 4 are grown in the same way as in the embodiment shown in FIG. 2, and the thickness of the optical guiding layer in only the region I is reduced by selective etching. Next, corrugation having the same period is formed on both regions. Since the thickness of the optical guiding layer between the regions I and II is different, their effective refractive indices are different, so that their bragg wavelengths are also different. Equivalently, therefore, the change of the thickness of the bragg wavelength is equal to the change of the effective refractive index ($n_{eff}$). To cite an example, the period of corrugation is 2,300 Å, the thickness of the optical guiding layer in the region I is 0.1 $\mu$m and the thickness of the optical guiding layer in the region II is 0.15 $\mu$m. In the case of this device, too, complete single mode oscillation of a 1.55 $\mu$m wavelength can be obtained as shown in FIG. 4.

Incidentally, the same reference numeral is used in FIG. 3 to identify the same portion as in FIG. 2.

FIGS. 5 through 11 are sectional views of semiconductor laser devices in accordance with other variations of the first embodiment of the present invention. All of them are sectional views on the plane parallel to the travelling direction of the laser light in the same way as in FIG. 2, and like reference numerals are used to identify like portions as in FIG. 2.

Figure 5:
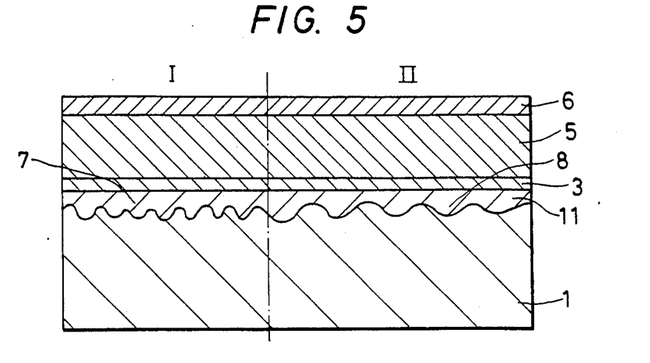
FIGS. 5 through 12 are sectional side views in accordance with other variations of the first embodiment of the present invention.

FIG. 5 shows the variation in which periodic corrugations 7 and 8 are disposed on the side of the substrate 1 with respect to the active layer. A semiconductor layer 11 is the optical guiding layer, and an n-type $In_{0.717}Ga_{0.283}As_{0.613}P_{0.387}$ layer may be used, for example. The compositions of the other layers may be the same as in the embodiment shown in FIG. 2. Incidentally, the n-type InGaAsP layer is 0.1 $\mu$m thick.

Figure 6:
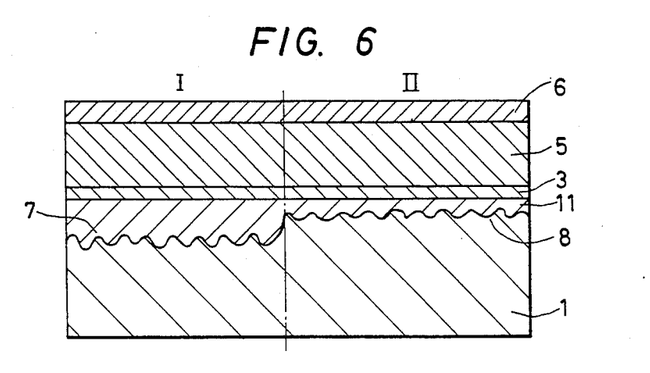

FIG. 6 shows the variation in which the periodic corrugations 7 and 8 are disposed also on the side of the substrate, and the thickness of the optical guiding layer 11 is different between the regions I and II. In this arrangement, the period of the periodic corrugations 7 and 8 is the same, i.e., 2,300 Å. The optical guiding layer 11 uses the afore-mentioned n-type $In_{0.717}Ga_{0.283}As_{0.613}P_{0.387}$ layer, for example, and the thickness is 0.2 $\mu$m for the region I and 0.1 $\mu$m for the region II.

Figure 7:
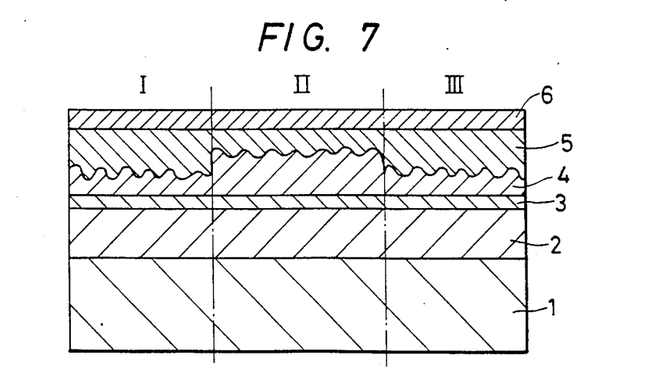

FIG. 7 shows the variation in which three different periodic regions are disposed. In this arrangement, the thickness of the optical guiding layer 4 is the same in the right and left regions I and III, and is greater in the region II. The period of the periodic corrugation is the same throughout the three regions I, II and III.

Figure 8:
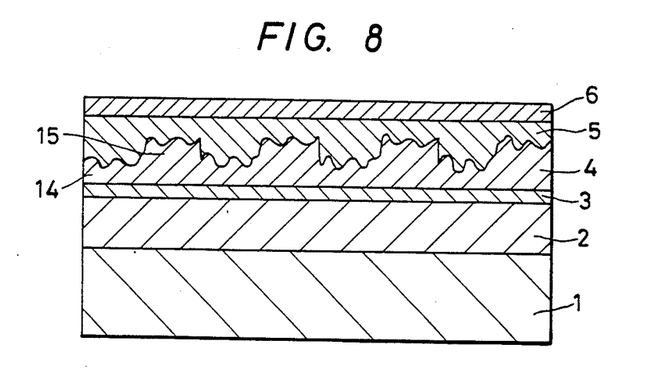

FIG. 8 shows the arrangement in which a large number of regions 15 having thick optical guiding layers and a large number of regions 14 having thin optical guiding layer are alternately disposed. The rest of constructions may be the same as in the embodiment shown in FIGS. 2 or 7.

The foregoing arrangements use the method of differentiating the period of the periodic corrugations of the grating or the method of differentiating the thickness of the optical guiding layers in order to differentiate the effective refractive indices ($n_{eff}$) of the divided regions. However, it is of course possible to use both of these methods in combination.

Figure 9:
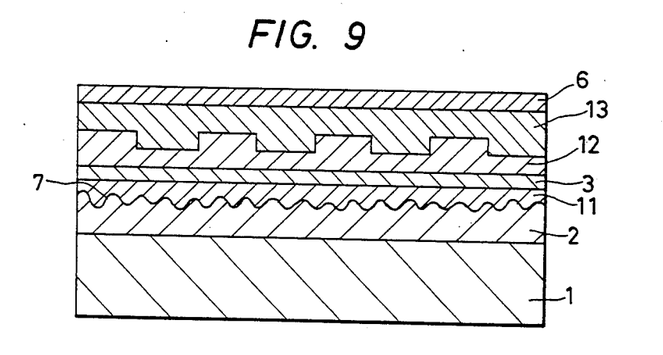

FIG. 9 shows the variation of the first embodiment in which the period of the periodic corrugation 7 of the grating is the same, the thickness of the optical guiding layer 11 is also constant, but the thickness of one of the cladding layers 12 is periodically changed in order to make different the Bragg wavelengths ($\lambda_b$) of the divided regions inside the optical resonator.

Figure 10:
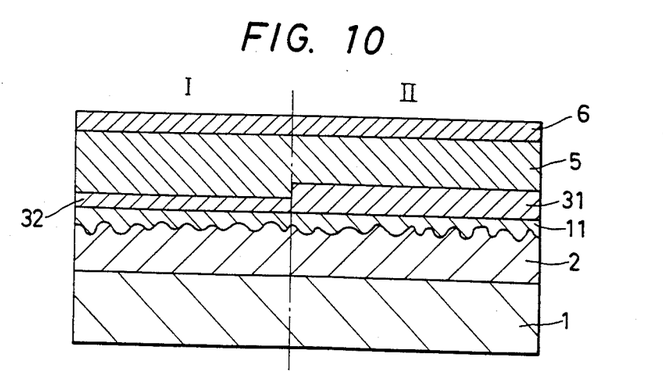

FIG. 10 shows the variation in which the thickness of the active layers is different. For example, they are 0.1 μm thick and 0.15 μm thick, to constitute the regions I and II, respectively. The same object can also be accomplished by changing their compositions while keeping the thickness of the active layer constant.

Figure 11:
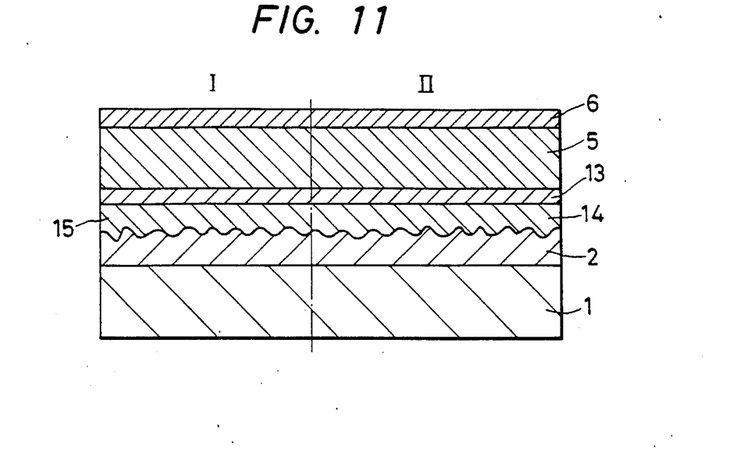

FIG. 11 shows the variation in which the compositions of the optical guiding layers 14 and 15 are changed. For example, the compositions may be selected so that the optical guiding layer 14 has a band gap wavelength of 1.3 μm and the optical guiding layer 15, a band gap wavelength of 1.25 μm.

Though the foregoing arrangements of the first embodiment deal with the InP-InGaAsP system semiconductor lasers, the present invention can of course be applied widely to compound semiconductor lasers such as GaAs-GaAlAs system lasers.

Figure 12:
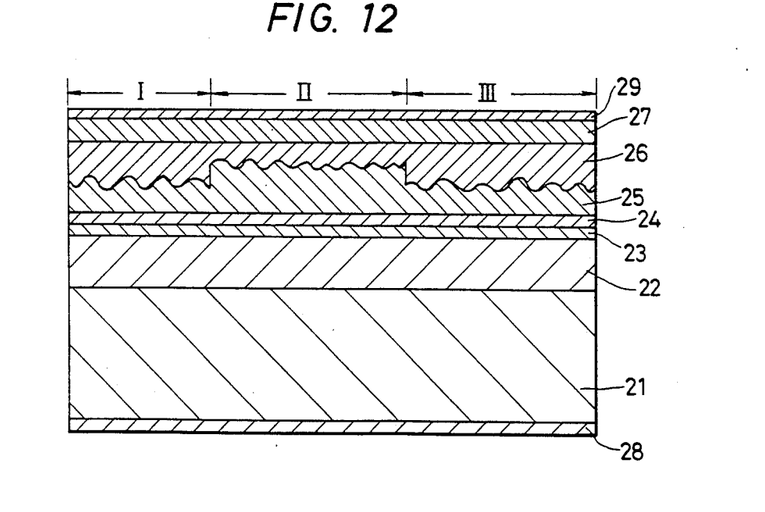

FIG. 12 shows a variation of the first embodiment of the GaAs-GaAlAs system. The fundamental construction is the same as that of the arrangement shown in FIG. 7.

An n-type $Ga_{0.6}Al_{0.4}As$ cladding layer (2.0 μm thick) 22, an undoped $Ga_{0.95}Al_{0.05}As$ active layer (0.1 μm thick) 23, a p-type $Ga_{0.6}Al_{0.4}As$ blocking layer (0.05 μm thick) 24, a p-type $Ga_{0.8}Al_{0.2}As$ optical guiding layer 25, a p-type $Ga_{0.6}Al_{0.4}As$ cladding layer (1.0 μm) 26 and a p-type GaAs cap layer (0.5 μm thick) 27 are arranged on an n-type GaAs substrate 21. In this arrangement, the optical resonator is divided into the regions I, II and III, and these regions are 0.1 μm thick, 0.2 μm thick and 0.1 μm thick, respectively. The pitch of the periodic corrugation is 2,370 Å and its height, 500 Å.

An electrode 29 is made of Cr-Au, while an electrode 28 consists of a laminate layer of AuGeNi-Au.

Embodiments 2 and 3

Figure 13:
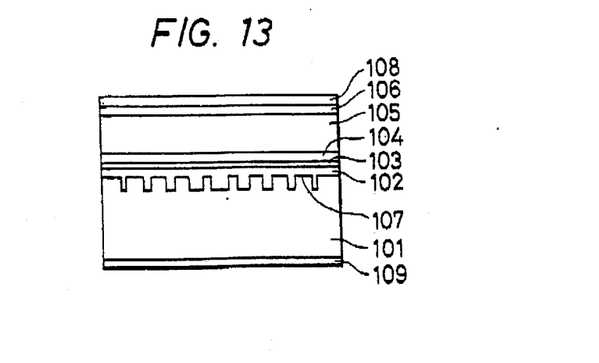
FIG. 13 shows a section of a second embodiment of the semiconductor laser device of the present invention.
Figure 14:
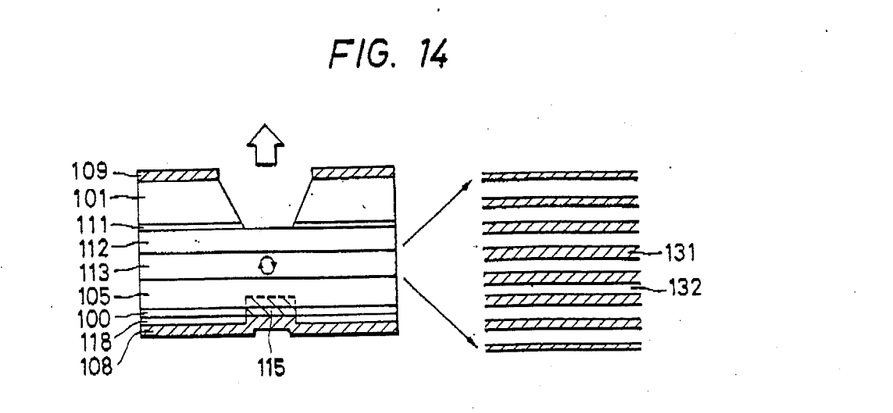
FIG. 14 shows a section of a third embodiment thereof.

FIG. 13 shows a section of a second embodiment of the semiconductor laser device according to the present invention, and FIG. 14 a section of a third embodiment thereof. The second embodiment shown in FIG. 13 has a structure formed in such a manner that the crystal thickness of an optical guide layer 102 is varied almost periodically and the portions thereof which are of different thickness are varied in width all over a cavity so that the refractive index of a waveguide can be varied almost periodically all over the cavity and the average refractive indexes in the central portion of the cavity and on the edge side thereof can be different from each other. A desired semiconductor laser device was obtained by the following processes. A resist is spin-coated on the whole surface of an n-type InP substrate 101, diffraction gratings of varied line width and having a fixed period of about 2300 Å are formed by an electron-beam drawing or an X-ray lithography using a metallic mask formed by electron beam drawings and thereafter the diffraction gratings varied within the range of a depth 400 Å and a width 300–1500 Å are transferred on the surface of the InP substrate 101 by an RIE (reactive ion etching). Next, by OMVPE (organo metallic vapor phase epitaxy), an n-type InGaAsP optical guide layer 102 (Te-doped, carrier density $2 \times 10^{18}$ cm$^{-3}$, average thickness 0.1–0.2 μm, band gap wavelength, $\lambda$g-1.3 μm), an InGaAsP active layer 103 (undoped, thickness 0.1–0.2 μm, $\lambda$g-1.5 μm), a p-type InGaAsP buffer layer 104 (Zn-doped, carrier density $1 \times 10^{18}$ cm$^{-3}$, thickness 0.1–0.2 μm, $\lambda$g-1.3 μm), a p-type InP layer 105 (Zn-doped, carrier density $1 \times 10^{17}$ cm$^{-3}$, thickness 2–4 μm), and a p-type InGaAsP surface layer 106 (Zn-doped, carrier density $3 \times 10^{18}$ cm$^{-3}$, thickness 0.2–0.4 μm) are superposed sequentially. Subsequently, a p-side electrode 108 (Au/Cr) and an n-side electrode (Au/AuGeNi) are formed on the upper and lower surfaces respectively by evaporation, and then cleavage is applied. In the semiconductor laser thus obtained, the average refractive index in the vicinity of the center of the cavity was larger than that in the vicinity of the opposite ends thereof; consequently, the oscillation mode on the shorter wavelength side of the Bragg wavelength oscillated, selectively, so as to generate a single-mode operation. It was effective, in the aforesaid semiconductor laser device as well, to form a silicon nitride anti reflection film having a thickness equivalent to λ/4 at least on one cleavage plane or on both cleavage planes, so as to prevent the occurrence of a Fabry Perot mode. It is not always necessary to set the period of the diffraction grating at a fixed value, although it was set so in the above-described embodiment, and the present invention was effective also in a chopped grating laser whose period was variable in the direction of the cavity.

The third embodiment shown in FIG. 14 is an application of the concept of the present patent to a plane emission type laser. This embodiment has a layered structure in which a light-emitting layer 113 serving as a distributed feedback cavity is composed of a layer 131 and a layer 132 having a lower refractive index than the former, and which is formed so that the thickness ratio between these layers is varied in various portions of the cavity. A desired element was obtained by the following processes. First an n-type InGaAsP layer 111 (Te-doped, carrier density $2 \times 10^{18}$ cm$^{-3}$, thickness 0.2–0.3 μm, $\lambda$g-1.15 μm) and an n-type InP layer 112 (Te-doped, carrier density $2 \times 10^{18}$ cm$^{-3}$, thickness 20 μm) are superposed on an n-type InP substrate 101 by OMVPE (organo metallic vapor phase epitaxy). Then, an n-type InP layer 131 (Te-doped, carrier density $1 \times 10^{18}$ cm$^{-3}$) and an n-type InGaAsP layer 132 (Te-doped, carrier density $1 \times 10^{18}$ cm$^{-3}$, composition $\lambda$g-1.5 μm) are combined alternately into a combination layer 113 with the period fixed at 234 nm and with the film thickness ratio between them set to be within the range of 10:1 to 1:1, and thereafter a p-type InP layer 105 (Zn-doped, carrier density $7 \times 10^{17}$ cm$^{-3}$, thickness 20 μm) and an undoped InGaAsP layer 100 (thickness 0.2–0.3 μm, composition $\lambda$g-1.3 μm) are superposed successively, so as to obtain a laser crystal. Next, a double-film insulator layer of $Si_3N_4/SiO_2$ is formed on the p-side surface of the element by sputtering, a round window of 20 μmφ is opened for partial excitation, and Zn is diffused in this portion. Afterward, an n-side electrode 109 (AuGeNi/Au) and a p-side electrode 108 (Au/Cr) are formed on the upper and lower surfaces of the element by evaporation, and a window of 100 μmφ is formed on the n side. The window in the layer 111 was formed in the following way. Using a resist mask having a round window, the electrode layer is removed by an etchant containing $Br_2$ or $I_2$, an InP layer 109 is etched thereafter by using an etchant containing $Cl_2$, and lastly the aforesaid window is opened by using an etchant whose main component is $H_2SO_4$.

The element thus obtained operated stably in a single mode. In the above-described laser device, too, the chopped grating described previously can be used jointly. In addition, both of the layers 131 and 132 are not always required to be single-layer films having the same composition. In other words, at least either one of them may be a multilayer film formed of InGaAsP and InP or of InGaAsP having a different composition, for instance.

What is claimed is:

1. In a distributed feedback semiconductor laser device, an arrangement comprising:
   an active layer for emitting light by an injected carrier;
   a cladding layer for confining said light in said active layer; and
   an optical guiding layer for guiding said light, said optical guiding layer including a grating which effects optical feedback by means of periodic corrugation,
   wherein said active layer is formed between said cladding layer and said optical guiding layer to form an optical resonator,
   wherein said optical resonator is comprised of a predetermined plurality of regions which have different Bragg wavelengths from one another,
   wherein said plurality of regions of said optical resonator are disposed longitudinally in the direction of an optical axis of said optical resonator, and
   wherein said optical resonator has a plurality of refractive indexes in the direction of said optical axis in each of said regions of said optical resonator arranged nonuniformly around an average value.

2. The distributed feedback semiconductor laser device as claimed in claim 1, wherein each of said plurality of regions of said optical resonator comprises said grating having periodic corrugations with a period which differs from that of other regions of said optical resonator.

3. The distributed feedback semiconductor laser device as claimed in claim 1, wherein the thickness of said optical guiding layer in one region of said optical resonator is different than that in other regions of said optical resonator.

4. The distributed feedback semiconductor laser device as defined in claim 2, wherein said regions of said optical resonator comprise a plurality of regions of said grating having different distances between said active layer and the surface of said periodic corrugation.

5. The distributed feedback semiconductor laser device as defined in claim 1, wherein said regions of said optical resonator comprise a plurality of regions of said grating having a difference of thickness in semiconductor layers having a smaller refractive index than an active layer existing on a side opposite to the side on which said corrugation exists, with said active layer being the center.

6. The distributed feedback semiconductor laser device as defined in claim 1, wherein the respective thickness of active layers of a plurality of said regions of said optical resonator are different from one another.

7. The distributed feedback semiconductor laser device as defined in claim 1, wherein respective optical guiding layers of a plurality of said regions of said optical resonator have different compositions.

8. The distributed feedback semiconductor laser device as defined in claim 1, wherein the respective thickness of cladding layers of a plurality of said regions of said optical resonator are different from one another.

9. In a semiconductor laser device, an arrangement comprising:
   an active layer which emits light; and
   a structure which forms a cavity with said active layer, wherein said structure is covered by a photoelectric field of said light and has effective refractive indexes thereof varied periodically and nonuniformly around an average value in a direction of an optical axis of said cavity.

10. A semiconductor laser device according to claim 9, wherein a period of repetition of said variation of said effective refractive indexes is fixed.

11. In a distributed feedback semiconductor laser device an arrangement comprising:
    a semiconductor substrate;
    stacked semiconductor layers formed on the semiconductor substrate, said stacked layers including an optical guiding layer and an active layer contacting the optical guiding layer, wherein an optical resonator is comprised of the optical guiding layer and the active layer, and further wherein said optical resonator includes a predetermined plurality of regions which have different Bragg wavelengths from one another;
    wherein the plurality of regions of the optical resonator are disposed longitudinally in a direction of an optical axis of the optical resonator, and
    wherein the optical resonator has a plurality of refractive indexes in the direction of the optical axis in each of the regions of the optical resonator arranged nonuniformly around an average value.

* * * * *